United States Patent
Kim et al.

(10) Patent No.: US 8,369,099 B2
(45) Date of Patent: Feb. 5, 2013

(54) ELECTRONICS DEVICE MODULE

(75) Inventors: Do Hyung Kim, Yongin-si (KR);
Jung-Mo Yang, Gwangmyeong-si (KR);
Hyun Jung Yoo, Seoul (KR);
Dong-Yoon Seo, Yongin-si (KR);
In-Young Park, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 106 days.

(21) Appl. No.: 12/656,451

(22) Filed: Jan. 29, 2010

(65) Prior Publication Data

US 2010/0195300 A1   Aug. 5, 2010

(30) Foreign Application Priority Data

Feb. 3, 2009   (KR) ........................ 10-2009-0008428

(51) Int. Cl.
*H05K 7/00*   (2006.01)

(52) U.S. Cl. ........ 361/760; 361/767; 361/778; 174/262; 174/263; 174/264; 333/1

(58) Field of Classification Search .............. 361/760, 361/767, 778; 174/262, 263, 264; 333/1, 333/254, 260
See application file for complete search history.

(56) References Cited

U.S. PATENT DOCUMENTS

| | | | | |
|---|---|---|---|---|
| 6,815,621 | B2* | 11/2004 | Park et al. | 174/260 |
| 7,576,995 | B2* | 8/2009 | Thomas et al. | 361/760 |
| 7,855,341 | B2* | 12/2010 | Chambers | 174/254 |
| 2010/0108369 | A1* | 5/2010 | Tom | 174/260 |

FOREIGN PATENT DOCUMENTS

| KR | 10-2002-0064525 | 8/2002 |
|---|---|---|
| KR | 10-0615606 | 8/2006 |
| KR | 10-2007-0064288 | 6/2007 |

* cited by examiner

*Primary Examiner* — Yuriy Semenenko
*Assistant Examiner* — Andargie M Aychillhum
(74) *Attorney, Agent, or Firm* — Harness, Dickey & Pierce, P.L.C.

(57) ABSTRACT

Disclosed is an electronic device module including a module substrate having first and second electronic device pair portions. The first electronic device pair portion may include a first and a second contact pad area and a first via area between the first and second contact pad areas. The first electronic device pair portion may also include a first layer and a second layer. The first layer may include a plurality of first lines connecting a plurality of contact pads in the first contact pad area on one side of the module substrate to a plurality of vias. The second layer may include a plurality of second lines connecting a plurality of contact pads in the second contact pad area to a plurality of vias in the via area. The second layer may also include a plurality of third lines connecting the first and second electronic device pair portions.

10 Claims, 6 Drawing Sheets

ELECTRONICS DEVICE MODULE

CROSS-REFERENCE TO RELATED APPLICATIONS

This application claims priority under 35 U.S.C. §119 to Korean Patent Application No. 10-2009-0008428, filed on Feb. 3, 2009, in the Korean Intellectual Property Office (KIPO), the entire contents of which are herein incorporated by reference.

BACKGROUND

1. Field

Example embodiments of inventive concepts relate to an electronic device module, and more particularly, to technology to reduce the number of layers in an electronic device module including a plurality of electronic devices mounted on both sides of a substrate.

2. Description of the Related Art

In a single surface mounting module including a plurality of electronic devices mounted on a single surface of a module substrate, there has been increased interest in a method of reducing the number of layers for wiring to save manufacturing costs. For example, the number of layers may be reduced by mounting the electronic devices on one side of the module substrate and using the other side thereof for wiring.

For a double-sided mounting product including a plurality of electronic devices mounted on both sides of a module substrate, there has been an increased demand to reduce the number of layers to save manufacturing costs. However, because the number of electronic devices mounted in the double-sided mounting product are twice or more as compared to the single side mounting product, wiring space is insufficient so that it may be difficult to reduce the number of layers.

In a conventional double-sided mounting memory module, for example, an address/command signal is applied to each of a pair of memory chips mounted on both sides of the module substrate. Also, a memory chip mounted on one side of the module substrate is connected to another memory chip mounted on the other side of the module substrate through a via. Furthermore, neighboring memory chip pairs are connected. Thus, it is difficult to reduce the number of layers.

SUMMARY

Example embodiments of inventive concepts provide an electronic device module which may reduce the number of layers for supplying signals to the electronic device module in which a plurality of electronic devices are mounted on both sides of a module substrate, thus manufacturing costs may be reduced or minimized and a manufacturing process may be simplified.

In accordance with example embodiments of inventive concepts, an electronic device module may include a module substrate having a first electronic device pair portion and a second electronic device pair portion. The first electronic device pair portion may include a first contact pad area and a second contact pad area on both sides of the module substrate. The first electronic device pair portion may also include a first via area between the first contact pad area and the second contact pad area, wherein the first via area including a plurality of vias. The first electronic device pair portion may also include a first layer on one side of the module substrate and a second layer on an other side of the module substrate. The first layer may include a plurality of first lines connecting a corresponding one of a plurality of contact pads in the first contact pad area on the one side of the module substrate to a corresponding one of the plurality of vias. The a second layer may include a plurality of second lines connecting a corresponding one of a plurality of contact pads in the second contact pad area on the other side of the module substrate to a corresponding one of the plurality of vias. The second layer may also include a plurality of third lines connecting the corresponding vias to the second electronic device pair portion.

The first and second contact pad areas may be arranged in form of a mirror on both sides of the module substrate. The plurality of third lines may be formed in a direction crossing the plurality of first lines in the first layer in the first via area.

The first layer further may include a plurality of fourth lines connecting a corresponding one of the plurality of contact pads in the second contact pad area on the one side of the module substrate to a corresponding one of the plurality of vias. The second layer may further include a plurality of fifth lines connecting a corresponding one of the plurality of contact pads in the first contact pad area on the other side of the module substrate to a corresponding one of the plurality of vias, and the second layer further may include a plurality of sixth lines connecting the vias connected to the plurality of fifth lines to the second electronic device pair portion.

The plurality of sixth lines may be formed in direction crossing the plurality of first lines and the plurality of fourth lines in the first layer in the first via area. The second electronic device pair portion may include a third contact pad area and a second via area. The third contact pad area and a fourth contact pad area may be on both sides of the module substrate. The second via area may include a plurality of vias between the third contact pad area and the fourth contact pad area.

The second layer may further include a plurality of seventh lines connecting a corresponding one of a plurality of contact pads in the third contact pad area on the other side of the module substrate to a corresponding one of the plurality of vias in the second via area. The first layer may further include a plurality of eighth lines connecting a corresponding one of a plurality of contact pads in the fourth contact pad area on the one side of the module substrate to a corresponding one of the plurality of vias in the second via area, and a plurality of ninth lines connecting the vias connected to the plurality of eighth lines in the second via area to the first electronic device pair portion.

The third and fourth contact pad areas may be arranged in form of a mirror on both sides of the module substrate. The plurality of ninth lines may be formed in a direction crossing the plurality of seventh lines in the second layer in the second via area.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS OF INVENTIVE CONCEPTS

Example embodiments of inventive concepts will now be described more fully with reference to the accompanying drawings, in which example embodiments of inventive concepts are shown. The inventive concepts may, however, be embodied in different forms and should not be construed as limited to example embodiments of inventive concepts as set forth herein. Rather, example embodiments of inventive concepts are provided so that this disclosure will be thorough and complete, and will fully convey the scope of the inventive concepts to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of inventive concepts described herein will refer to plan views and/or cross-sectional views by way of ideal schematic views. Accordingly, the views may be modified depending on manufacturing technologies and/or tolerances. Therefore, example embodiments of inventive concepts are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments of inventive concepts. The attached drawings for illustrating example embodiments of inventive concepts are referred to in order to gain a sufficient understanding of the inventive concept and the merits thereof. Hereinafter, the inventive concept will be described in detail by explaining example embodiments of inventive concepts with reference to the attached drawings. Like reference numerals in the drawings denote like elements.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Figure 1:
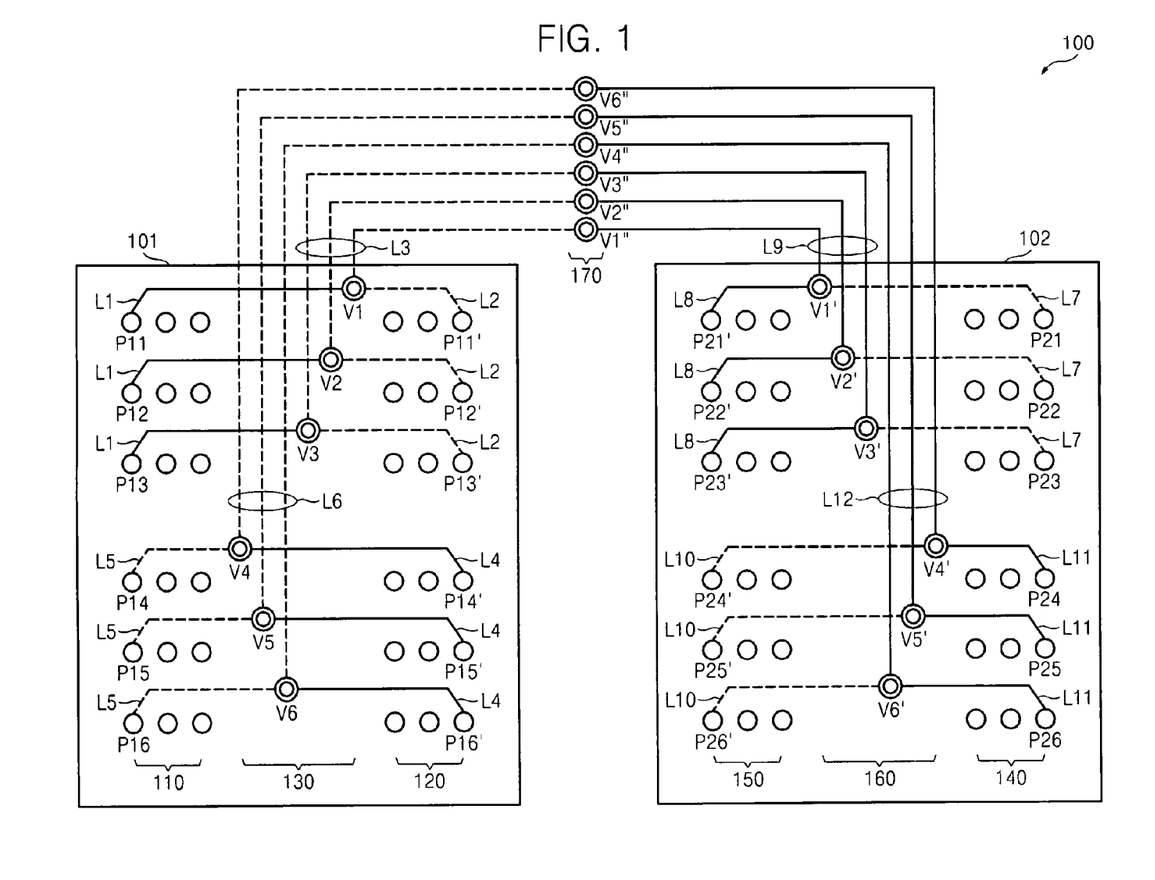
FIG. 1 is a schematic wiring diagram of an electronic device module according to example embodiments of inventive concepts.

FIG. 1 is a schematic wiring diagram 100 of an electronic device module according to example embodiments of inventive concepts. Referring to FIG. 1, the wiring diagram 100 of the electronic device module may include a first electronic device pair portion 101 for a first electronic device pair (not shown) and a second electronic device pair portion 102 for a second electronic device pair (not shown) that is close to the first electronic device pair.

The first electronic device pair portion 101 is a portion on which the first electronic device pair is mounted. The first electronic device pair portion 101 may include a first contact pad area 110, a second contact pad area 120, a first via area 130, a first layer including a plurality of lines L1 and L4 indicated by solid lines, and a second layer including a plurality of lines L2, L3, L5, and L6 indicated by dotted lines.

The first and second layers may be wirings to apply signals to a plurality of electronic devices mounted on both sides of a module substrate. The contact pad pairs may be connected to each other via the first layer, the second layer, and a plurality of vias and the contact pad pairs may be connected to apply the same signals to the electronic device pairs.

In a memory module in which a plurality of semiconductor chips are mounted on both sides of a module substrate, the first and second layers may be wirings for applying signals to the semiconductor chips mounted on both sides of the module substrate. In the memory module, the signals may be an address signal or a command signal commonly applied to the memory chips mounted on both sides of the module substrate.

A conventional electronic device module, in which a plurality of electronic devices is mounted on both sides of a general substrate module, may include at least five layers. For example, the at least five layers may include a power line layer, a ground line layer, and at least three signal application layers. Each of the power line layer and the ground line layer may be implemented as a single layer for stable power supply and noise characteristic improvement.

The electronic device module according to example embodiments of inventive concepts reduces or minimizes the number of layers for signal application. The first contact pad area 110 and the second contact pad area 120 may be arranged on both sides of the module substrate in form of a mirror with respect to the center of the first electronic device pair portion 101. The first contact pad area 110 may include a plurality of contact pads P11-P16 on which the first electronic device pair is mounted. The second contact pad area 120 may include a plurality of contact pads P11'-P16' on which the first electronic device pair is mounted.

The first via area 130 may include a plurality of vias V1-V6 formed between the first and second contact pad areas 110 and 120. The first electronic device pair mounted on both sides of the module substrate may be connected to each other through the vias V1-V6. That is, the first layer and the second layer may be connected to each other through the plurality of vias V1-V6.

The first layer may include a plurality of first lines L1. The first lines L1 may connect the corresponding contact pads P11, P12, and P13 of the contact pads P11-P16 included in the first contact pad area 110 on one side of the module substrate to the corresponding vias V1, V2, and V3 of the vias V1-V6. The second layer may include a plurality of second lines L2. The second lines L2 may connect the corresponding contact pads P11', P12', and P13' of the contact pads P11'-P16' included in the second contact pad area 120 on the other side of the module substrate to the vias V1, V2, and V3 of the vias V1-V6.

The second layer may include a plurality of third lines L3 connecting the corresponding vias V1, V2, and V3 to the second electronic device pair. The third lines L3 may connect the corresponding vias V1, V2, and V3 to the second electronic device pair portion 102 and the second electronic device pair through corresponding vias V1", V2", and V3" of a plurality of vias V1"-V6" included in a third via area 170.

The third lines L3 may be formed in a direction crossing the first lines L1 included in the first layer formed in the first via area 130. Referring to FIG. 1, it may be seen that, while the first lines L1 may be formed in the horizontal direction, the third lines L3 may be formed in the vertical direction, example embodiments of inventive concepts are not limited thereto.

Also, the first layer may include a plurality of fourth lines L4. The fourth lines L4 may connect the corresponding contact pads P14', P15', and P16' of the contact pads P11'-P16' included in the second contact pad area 120 on the one side of the module substrate to the corresponding vias V4, V5, and V6 of the vias V1-V6.

The second layer may further include a plurality of fifth lines L5 and a plurality of sixth lines L6. The fifth lines L5 may connect the corresponding contact pads P14, P15, and P16 of the contact pads P11-P16 included in the first contact pad area 110 on the other side of the module substrate to the corresponding vias V4, V5, and V6 of the vias V1-V6.

The sixth lines L6 may connect the corresponding vias V4, V5, and V6 to the to the second electronic device pair portion 102 and the second electronic device pair through the corresponding vias V4", V5", and V6" of the vias V1"-V6" included in the third via area 170. The sixth lines L6 may be formed in a direction crossing the first lines L1 and the fourth lines L4 included in the first layer formed in the first via area 130.

Referring to FIG. 1, it may be seen that, the first lines L1 and the fourth lines L4 may be formed in the horizontal direction and the sixth lines L6 may be formed in the vertical direction. However, example embodiments of inventive concepts are not limited thereto.

Referring to the first electronic device pair portion 101 of FIG. 1, the vias V1-V6 included in the first via area 130 are located by being deviated from the center of the first electronic device pair portion 101 toward either the first contact pad area 110 or the second contact pad area 120. The third lines L3 and the sixth lines L6 connecting the vias V1-V6 included in the first via area 130 to the vias V1"-V6" included in the third via area 170 do not cross each other.

Thus, the electronic device module according to example embodiments of inventive concepts may apply a signal to the first electronic device pair mounted on both sides of the module substrate by using two layers, unlike a conventional electronic device module including at least three layers for signal application.

The second electronic device pair portion 102 is a portion on which the second electronic device pair is mounted. The second electronic device pair portion 102 may include a third contact pad area 140, a fourth contact pad area 150, a second via area 160, a first layer including a plurality of lines L8, L9, L11, and L12 indicated by solid lines, and a second layer including a plurality of lines L7 and L10 indicated by dotted lines.

The first and second layers may be wirings to apply signals to a plurality of electronic devices mounted on both sides of the module substrate. The contact pad pairs may be connected to each other via the first layer, the second layer, and a plurality of vias may be contact pad pairs may be connected to apply the same signals to the electronic device pairs.

The third contact pad area 140 and the fourth contact pad area 150 may be arranged on both sides of the module substrate in form of a mirror with respect to a center of the second electronic device pair portion 102. The third contact pad area 140 may include a plurality of contact pads P21-P26 for mounting the second electronic device pair. The fourth contact pad area 150 may include a plurality of contact pads P21'-P26' for mounting the second electronic device pair.

The second via area 160 may include a plurality of vias V1'-V6' formed between the third and fourth contact pad areas 140 and 150. The second electronic device pair mounted on both sides of the module substrate may be connected to each other through the vias V1'-V6'.

The first layer may include a plurality of eighth lines L8 and a plurality of ninth lines L9. The eighth lines L8 may connect the corresponding contact pads P21', P22', and P23' of the contact pads P21'-P26' included in the fourth contact pad area 150 on the one side of the module substrate to the corresponding vias V1', V2', and V3' in the second via area 160.

The second layer may include a plurality of seventh lines L7. The seventh lines L7 may connect the corresponding contact pads P21, P22, and P23 of the contact pads P21-P26 included in the third contact pad area 140 on the other side of the module substrate to the corresponding vias V1', V2', and V3' of the vias V1'-V6' included in the second via area 160.

The ninth lines L9 may connect the corresponding vias V1', V2', and V3' in the second via area 160 to the first electronic device pair 101 and the first electronic device pair through the corresponding vias V1", V2", and V3" of the vias V1"-V6" included in the third via area 170.

The ninth lines L9 may be formed in a direction crossing the seventh lines L7 included in the second layer. As shown in FIG. 1, the ninth lines L9 may be formed on the second via area 160. Referring to FIG. 1, it may be seen that, while the seventh lines L7 may be formed in the horizontal direction, the ninth lines L9 may be formed in the vertical direction. However, example embodiments of inventive concepts are not limited thereto.

The second layer may also include a plurality of tenth lines L10. The tenth lines L10 may connect the corresponding contact pads P24', P25', and P26' of the contact pads P21'-P26' included in the fourth contact pad area 150 on the other side of the module substrate to the corresponding vias V4', V5', and V6' of the vias V1'-V6'.

The first layer may include a plurality of eleventh lines L11 and a plurality of twelfth lines L12. The eleventh lines L11 may connect the corresponding contact pads P24, P25, and P26 of the contact pads P21-P26 included in the third contact pad area 140 on the one side of the module substrate to the corresponding vias V4', V5', and V6' of the vias V1'-V6'.

The twelfth lines L12 may connect the corresponding vias V4', V5', and V6' to the first electronic device pair through the corresponding vias V4", V5", and V6" of the vias V1"-V6" included in the third via area 170. The twelfth lines L12 may be formed in a direction crossing the seventh lines L7 and the tenth lines L10 included in the second layer formed in the second via area 160.

Referring to FIG. 1, it may be seen that, while the seventh lines L7 and the tenth lines L10 may be formed in the horizontal direction, the ninth lines L9 and the twelfth lines 12 may be formed in the vertical direction. However, example embodiments of inventive concepts are not limited thereto.

Referring to the second electronic device pair portion 102 of FIG. 1, the vias V1'-V6' included in the second via area 160 may be located by being deviated from a center of the second electronic device pair portion 102 toward either the third contact pad area 140 or the fourth contact pad area 150. The ninth lines L9 and the twelfth lines L12 connecting the vias V1'-V6' included in the second via area 160 and the vias V1"-V6" included in the third via area 170 do not cross each other.

Thus, the electronic device module according to example embodiments of inventive concepts may apply a signal to the second electronic device pair mounted on both sides of the module substrate by using two layers, unlike the conventional electronic device module including at least three layers for signal application.

Referring to FIG. 1, it may be seen that the lines connected to the vias V1"-V6" included in the third via area 170 to connect the first electronic device pair to the second electronic device pair are included in the second layer of the first electronic device pair portion 101 and the first layer of the second electronic device pair portion 102. This means that the first electronic device pair and the second electronic device pair receive signals by using the different layers. For example, one first electronic device mounted on one side of the module substrate may receive a signal by using the first layer and another first electronic device mounted on the other side of the module substrate receives the signal by using the second layer.

In addition, one second electronic device mounted on the one side of the module substrate may receive a signal by using the second layer, whereas another second electronic device mounted on the other side of the module substrate receives the signal by using the first layer. Accordingly, the neighboring first and second electronic device pairs may be connected to each other by using two layers. When the lines are connected by using the layers that are not reversed, the lines cross each other so that the two layers may not connect the neighboring first and second electronic device pairs.

As described above, an electronic device module according to example embodiments of inventive concepts as illustrated in FIG. 1 may apply the same signals to the electronic device pairs mounted on both sides of the module substrate by using two layers and connecting the neighboring electronic device pairs. Thus, the electronic device module according to example embodiments of inventive concepts has a relatively low manufacturing cost and simplified manufacturing process as compared to a conventional double-sided mounting electronic device module.

Figure 2:
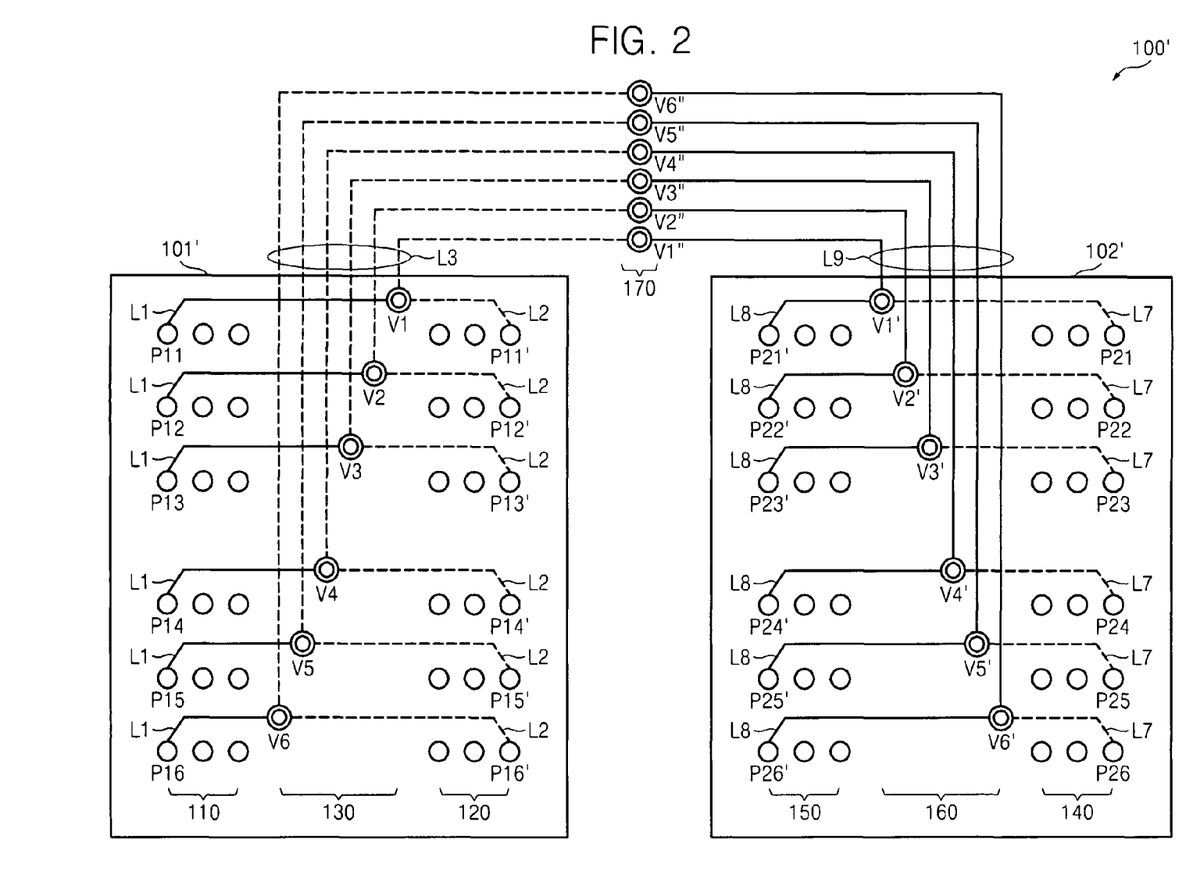
FIG. 2 is a schematic wiring diagram of an electronic device module according to example embodiments of inventive concepts.

FIG. 2 is a schematic wiring diagram 100' of an electronic device module according to example embodiments of inventive concepts. Referring to FIG. 2, the wiring diagram 100' of an electronic device module includes a first electronic device pair portion 101' for a first electronic device pair (not shown) and a second electronic device pair portion 102' for a second electronic device pair (not shown) that is close to the first electronic device pair.

The first electronic device pair portion 101' is a portion on which the first electronic device pair may be mounted. The first electronic device pair portion 101' may include the first contact pad area 110, the second contact pad area 120, the first via area 130, a first layer including a plurality of lines L1 indicated by solid lines, and a second layer including a plurality of lines L2 and L3 indicated by dotted lines.

The second electronic device pair portion 102' is a portion on which the second electronic device pair is mounted. The second electronic device pair portion 102' includes the third contact pad area 140, the fourth contact pad area 150, the second via area 160, a first layer including a plurality of lines L8 and a plurality of lines L9 indicated by solid lines, and a second layer including a plurality of lines L7 indicated by dotted lines.

In the wiring diagram 100' of FIG. 2 (hereinafter, referred to as the second wiring diagram 100'), the first electronic device pair portion 101' and the second electronic device pair portion 102' may receive signals by using the different layers, as in the wiring diagram 100 of FIG. 1 (hereinafter, referred to as the first wiring diagram 100). The second wiring diagram 100' has a similar structure to the first wiring diagram 100. Thus, the second wiring diagram 100' will be described mainly based on the differences between the first and second wiring diagrams 100 and 100'.

Each of the contact pads P11-P16 included in the first contact pad area 110 of the second wiring diagram 100' may be connected to a corresponding one of the vias V1-V6 included in the first via area 130 by the first lines L1 included in the first layer. Also, each of the contact pads P21-P26 included in the third contact area 140 of the second wiring diagram 100' may be connected to a corresponding one of the vias V1'-V6' included in the second via area 160 by the seventh lines L7 included in the second layer.

Each of the contact pads P11'-P16' included in the second contact pad area 120 of the second wiring diagram 100' may be connected to a corresponding one of the vias V1-V6 included in the first via area 130 by the second lines L2 included in the second layer. Also, each of the contact pads P21'-P26' included in the fourth contact pad area 150 of the second wiring diagram 100' may be connected to a corresponding one of the vias V1'-V6' included in the second via area 160 by the eighth lines L8 included in the first layer.

The vias V1-V6 included in the first via area 130 of the second wiring diagram 100' may not be formed by being deviated from the center of the first electronic device pair portion 101' toward either the first contact pad area 110 or the second contact pad area 120. However, as in the first wiring diagram 100, the third lines L3 connecting the vias V1-V6 and the vias V1"-V6" of the third via area 170 do not cross each other.

Also, the vias V1'-V6' included in the second via area 160 of the second wiring diagram 100' may not be formed by being deviated from the center of the second electronic device pair portion 102' toward either the third contact pad area 140 or the fourth contact pad area 150. However, as in the first wiring diagram 100, the ninth lines L9 connecting the vias V1'-V6' to the vias V1"-V6" of the third via area 170 do not cross each other.

As described above, the second wiring diagram 100' has a structural difference from the first wiring diagram 100. However, as in the first wiring diagram 100, the third and ninth lines L3 and L9 connecting the first electronic device pair to the second electronic device pair do not cross each other in the second wiring diagram 100'.

Thus, the electronic device module according to example embodiments of inventive concepts based on the second wiring diagram 100' may apply the same signals to the electronic device pairs mounted on both sides of the module substrate by using two layers. Also, as the neighboring electronic device pairs are connected, the manufacturing costs may be reduced or minimized and the manufacturing process may be simplified as compared to the conventional double-sided mounting electronic device module.

Figure 3:
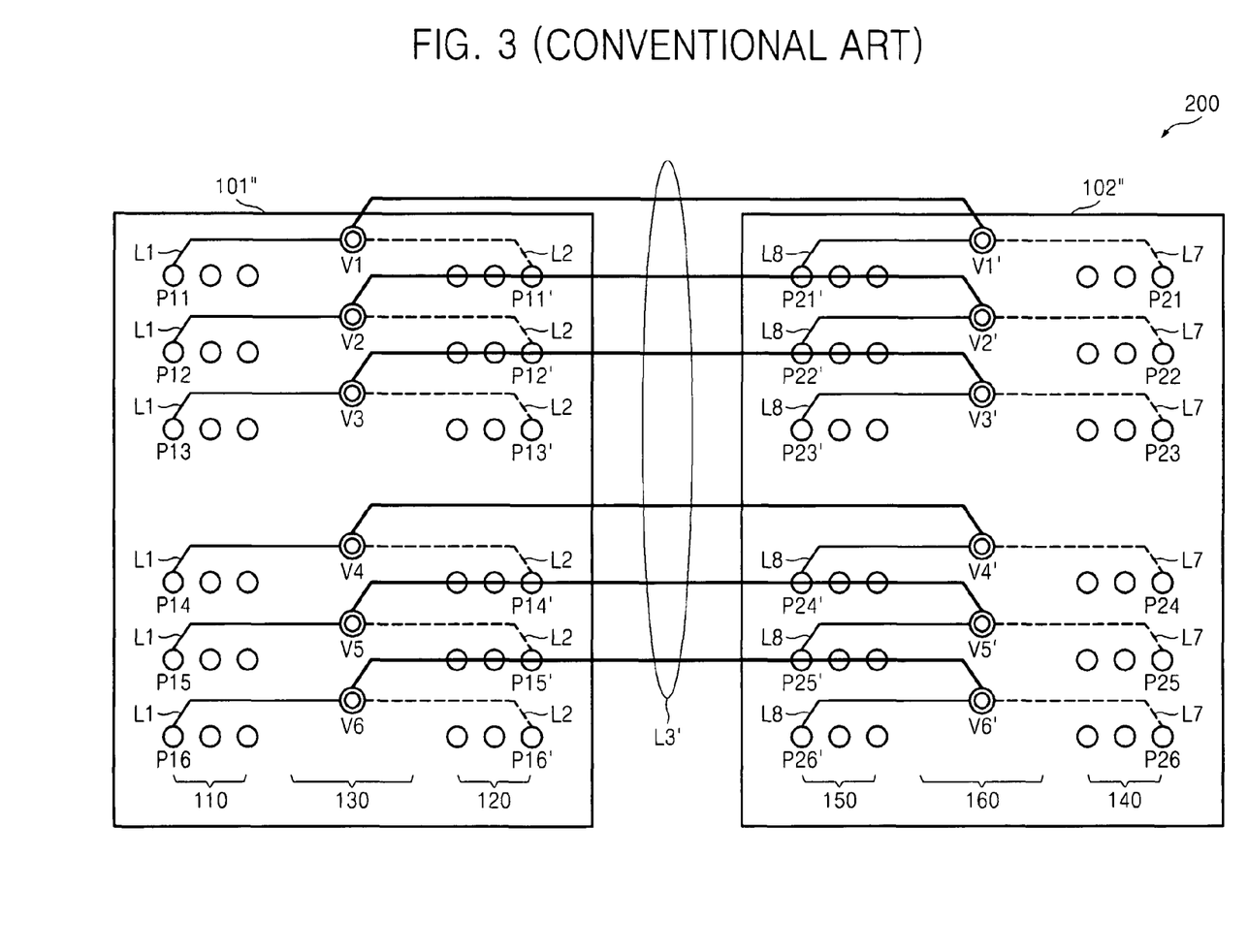
FIG. 3 is a schematic wiring diagram of a conventional electronic device module.

FIG. 3 is a schematic wiring diagram 200 (hereinafter, referred to as the third wiring diagram). The third wiring diagram 200 illustrated in FIG. 3 is a wiring diagram of a conventional double-sided mounting electronic device module.

Referring to FIG. 3, in the third wiring diagram 200, unlike the first and second wiring diagrams 100 and 100', each of the contact pads P11-P16 and P21'-P26', respectively, included in the first and fourth contact pad areas 110 and 150 is connected to a corresponding one of the vias V1-V6 and V1'-V6', respectively, included in the first and second via areas 130 and 160 through the lines L1 and L8 included in the first layer.

Also, in the third wiring diagram 200, unlike the first and second wiring diagrams 100 and 100', each of the contact pads P11'-P16' and P21-P26, respectively, included in the second and third contact pad areas 120 and 140 is connected to a corresponding one of the vias V1-V6 and V1'-V6', respectively, included in the first and second via areas 130 and 160 through the lines L2 and L7 included in the second layer.

The third wiring diagram 200 further includes a third layer including a plurality of lines L3' to connect the first electronic device pair portion 101" to the second electronic device pair portion 102", in addition to the first and second layers. This is because lines cross each other when the neighboring electronic device pairs are connected by using the first or second layer.

Figure 4:
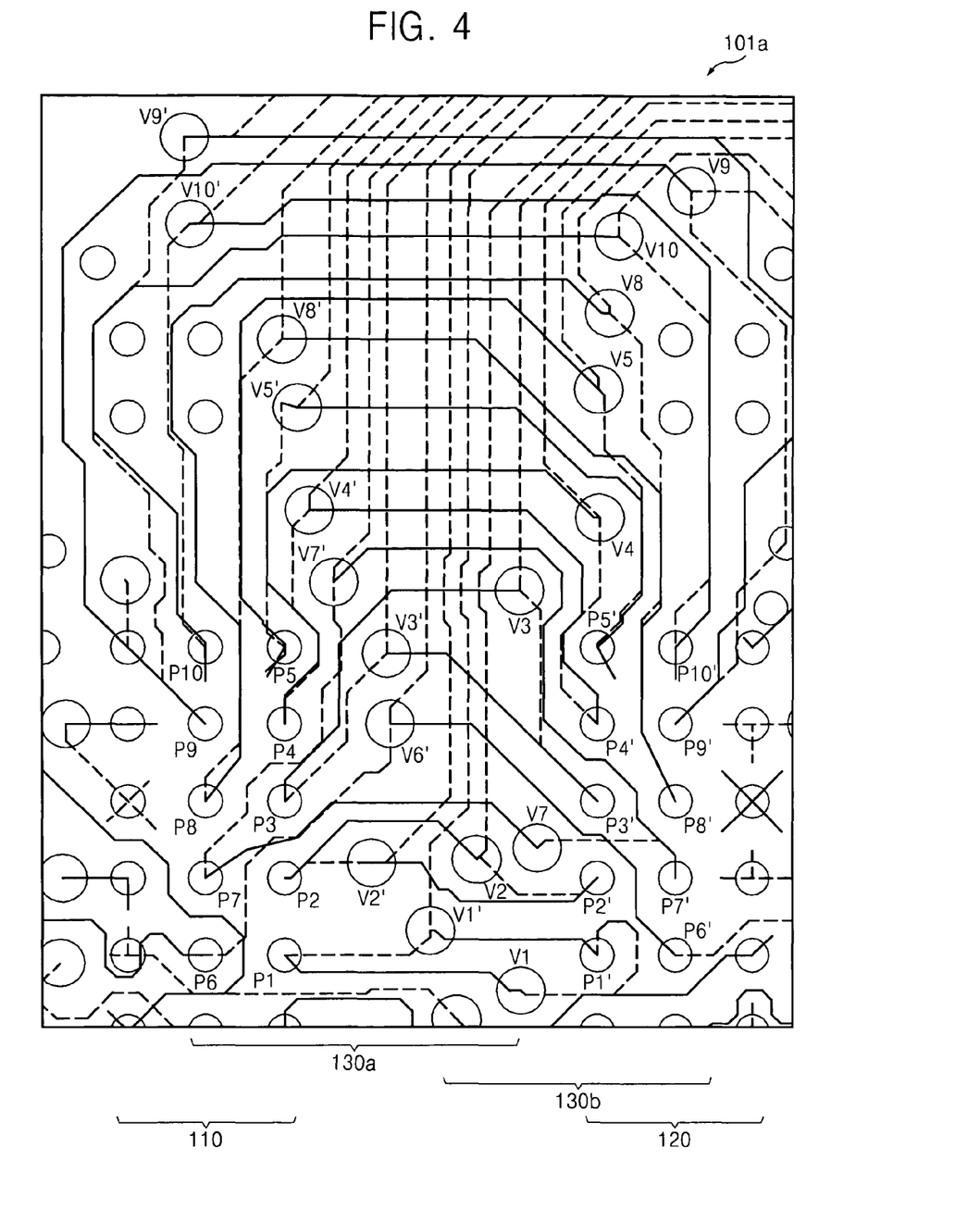
FIG. 4 is a wiring diagram of a first electronic device pair of the electronic device module according to example embodiments of inventive concepts.

FIG. 4 is an actual wiring diagram 101a (hereinafter, referred to as the fourth wiring diagram) of a first electronic device pair of the electronic device module according to example embodiments of inventive concepts. Referring to FIG. 4, the fourth wiring diagram 101a includes the first contact pad area 110, the second contact pad area 120, a first via area 130a, a second via area 130b, the first layer indicated by solid lines, and the second layer indicated by dotted lines.

The first via area 130a is formed at the side of the first contact pad area 110 between the first contact pad area 110 and the second contact pad area 120 and includes a plurality of vias V1'-V10'. The second via area 130b is formed at the side of the second contact pad area 120 between the first contact pad area 110 and the second contact pad area 120 and includes a plurality of vias V1-V10. Referring to FIG. 4, it may be seen that there is a portion where the first and second via areas 130a and 130b overlap each other.

The first layer connects each of a plurality of contact pads P1-P10 included in the first contact pad area 110 on one side of the module substrate to a corresponding one of a plurality of vias V1-V5 and V7-V10 included in the second via area 130b. Also, the first layer connects each of a plurality of contact pads P1'-P10' included in the second contact pad area 120 on the one side of the module substrate to a corresponding one of a plurality of vias V1'-V10' included in the first via area 130a.

The second layer connects each of the contact pads P1-P10 included in the first contact pad area 110 on the other side of the module substrate to a corresponding one of the vias V1'-V10' included in the first via area 130a. Also, the second layer connects each of the contact pads P1'-P10' included in the second contact pad area 120 to a corresponding one of the vias V1-V5 and V7-V10 included in the second via area 130b. Furthermore, the second layer includes a plurality of lines to connect the vias V1'-V10' and V1-V10, except for V1 and V7, included in the first and second via areas 130a and 130b to a neighboring electronic device pair.

Referring to FIG. 4, the lines connecting the first and second electronic device pairs in the second layer are formed in a direction crossing a plurality of lines included in the first layer formed between the first and second via areas 130a and 130b. That is, it may be seen that, while the lines included in the first layer formed between the first and second via areas 130a and 130b are formed in a substantially horizontal direction, the lines connecting the first electronic device pair to the second electronic device pair in the second layer are formed in a vertical direction. However, the example embodiments of inventive concepts are not limited thereto.

Also, it may be seen that the lines connecting the vias V1'-V10' to V1-V10 included in the first and second via areas 130a and 130b to the second electronic device pair do not cross each other. Thus, the electronic device module according to example embodiments of inventive concepts based on the fourth wiring diagram 101a may apply signals to the second electronic device pair mounted on both sides of the module substrate by using two layers, unlike a conventional electronic device module including at least three layers for signal application.

Figure 5:
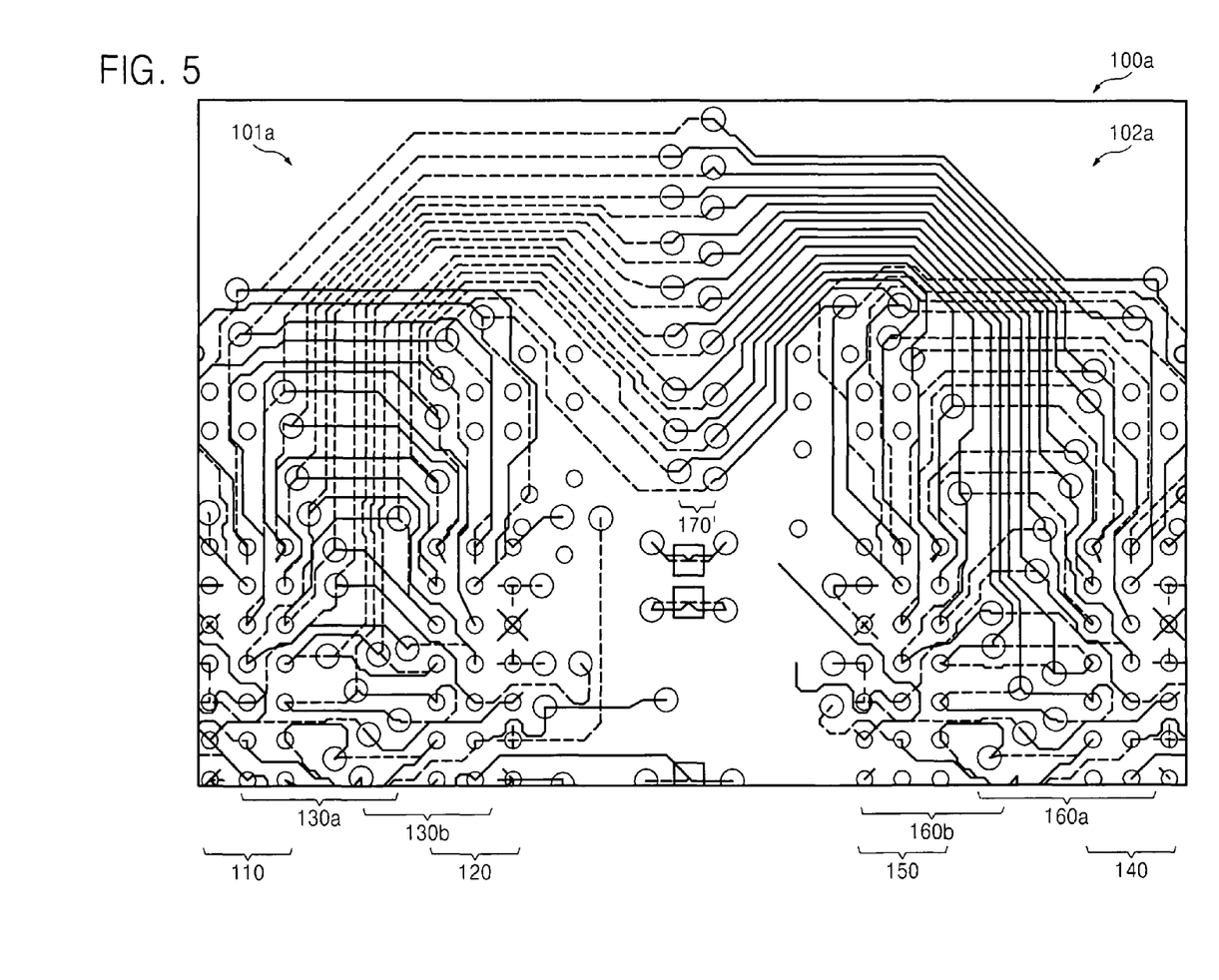
FIG. 5 is wiring diagram showing the connection between neighboring electronic device pairs of the electronic device module according to example embodiments of inventive concepts.

FIG. 5 is an actual wiring diagram 100a (hereinafter, referred to as the fifth wiring diagram) showing the connection between neighboring electronic device pairs of the electronic device module of the present inventive concept. In the fifth wiring diagram 100a, a small circle denotes a contact pad and a large circle denotes a via.

Referring to FIG. 5, the fifth wiring diagram 100a may include a first electronic device pair portion 101a and a second electronic device pair portion 102a. Since the first electronic device pair portion 101a corresponds to the fourth wiring diagram 101a of FIG. 4, a detailed description thereof will be omitted herein.

In the fifth wiring diagram 100a, the first electronic device pair portion 101a and the second electronic device pair portion 102a may be wired by using the reversed layers as illustrated in the first and second wiring diagrams 100 and 100'.

For example, when the wiring of the electronic device mounted on one side of the module substrate of the first electronic device pair portion 101a of the fifth wiring diagram 100a forms a first layer and the wiring of the electronic device mounted on the other side of the module substrate forms a second layer, the wiring of the electronic device mounted on the one side of the module substrate of the second electronic device pair portion 102a may form the first layer and the wiring of the electronic device mounted on the other side of the module substrate may form the second layer.

The second electronic device pair portion 102a may include a third contact pad area 140, a fourth contact pad area 150, a third via area 160a, a fourth via area 160b, a first layer indicated by solid lines, and a second layer indicated by dotted lines. The third and fourth via areas 160a and 160b may be respectively formed at the sides of third and fourth contact pad areas 140 and 150, and each may include a plurality of vias.

The second layer may connect the contact pads included in the third contact pad area 140 on other side of the module substrate to the vias included in the fourth via area 160*b*, and may also connect the contact pads included in the fourth contact pad area 150 on the other side of the module substrate to the vias included in the third via area 160*a*.

The first layer may connect the contact pads included in the third contact pad area 140 on the one side of the module substrate to the vias included in the third via area 160*a*, and may connect the contact pads included in the fourth contact pad area 150 on the one side of the module substrate to the vias included in the fourth via area 160*b*. The first layer may be formed between the third and fourth via areas 160*a* and 160*b*, and may include the lines connecting the vias included in the third and fourth via areas 160*a* and 160*b* through a plurality of vias included in the fifth via area 170'.

It may be seen that the lines connecting the second electronic device pair to the first electronic device pair in the first layer are formed in a direction crossing the lines included in the second layer formed between the third and fourth via areas 160*a* and 160*b*, and the lines connecting the second electronic device pair to the first electronic device pair in the first layer are formed such that they do not cross each other. Thus, the second electronic device pair may apply a signal to the second electronic device pair mounted on both sides of the module substrate by using two layers.

Also, because the electronic device module based on the fifth wiring diagram 100*a* may connect the neighboring electronic device pairs by using the vias included in the first layer, the second layer, and the fifth via areas 170', the manufacturing costs may be relatively low and the manufacturing process may be simplified compared to the conventional double-sided mounting electronic device module.

Figure 6:
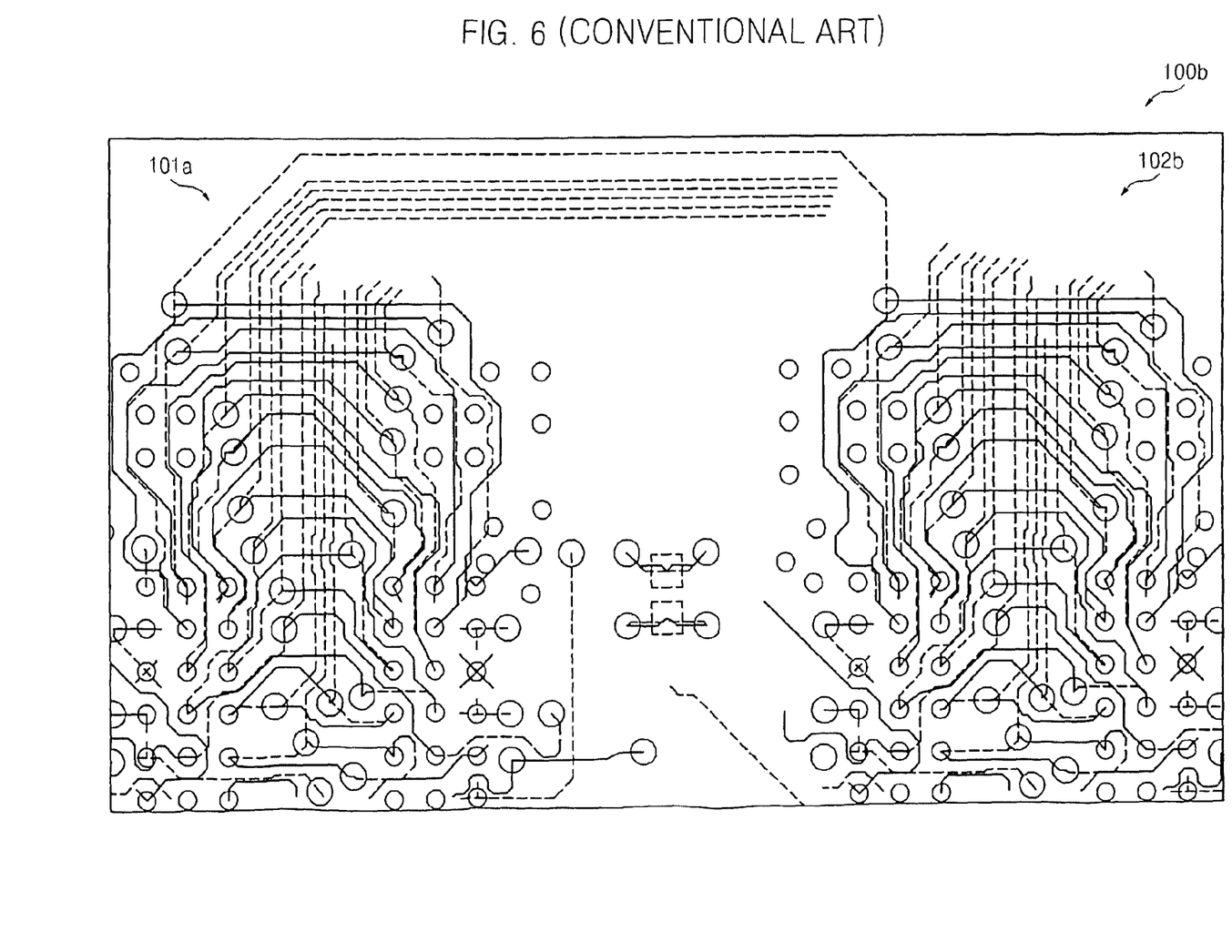
FIG. 6 is a wiring diagram of an electronic device module according to a comparative example of an electronic device module according to example embodiments of inventive concepts.

FIG. 6 is a wiring diagram 100*b* (hereinafter, referred to as the sixth wiring diagram) of an electronic device module according to a comparative example of the electronic device module of the present inventive concept. Referring to FIG. 6, it may be seen that a first electronic device pair portion 101*a* and a second electronic device pair portion 102*b* are wired by using layers that are not reversed.

Thus, the electronic device module using the sixth wiring diagram 100*b* may not connect the neighboring electronic device pairs by using two layers unlike the electronic device module based on the first, second, and fifth wiring diagrams 100, 100', and 100*a*.

As described above, in the electronic device module according to example embodiments of the inventive concepts, because the number of layers supplying signals to electronic devices mounted on both sides of a module substrate is reduced, manufacturing costs may be saved and a manufacturing process may be simplified.

While inventive concepts has been particularly shown and described with reference to example embodiments thereof, it will be understood that various changes in form and details may be made therein without departing from the spirit and scope of the following claims.

What is claimed is:

1. An electronic device module comprising:
 a module substrate having a first electronic device pair portion and a second electronic device pair portion,
 wherein the first electronic device pair portion includes
  a first contact pad area and a second contact pad area on both sides of the module substrate;
  a first via area between the first contact pad area and the second contact pad area, the first via area including a plurality of vias;
 a first layer on one side of the module substrate, the first layer including a plurality of first lines connecting a corresponding one of a plurality of contact pads in the first contact pad area on the one side of the module substrate to a corresponding one of the plurality of vias;
 a second layer on an other side of the module substrate, the second layer including
  a plurality of second lines connecting a corresponding one of a plurality of contact pads in the second contact pad area on the other side of the module substrate to a corresponding one of the plurality of vias, and
  a plurality of third lines connecting the corresponding vias to the second electronic device pair portion; and
 a second via area between the first contact pad area and the first via area, the second via area including a plurality of vias, wherein
 the first layer further includes a plurality of fourth lines connecting a corresponding one of the plurality of contact pads in the second contact pad area on the one side of the module substrate to a corresponding one of the plurality of vias in the second via area, and
 the second layer further includes a plurality of fifth lines connecting a corresponding one of the plurality of contact pads in the first contact pad area on the other side of the module substrate to a corresponding one of the plurality of vias in the second via area and a plurality of sixth lines connecting the corresponding vias in the second via area to the second electronic device pair portion, the plurality of sixth lines formed in a direction crossing the plurality of first and fourth lines included in the first layer that is between the first via area and the second via area; and
 wherein the second electronic device pair portion includes
  a third contact pad area and a fourth contact pad area on both sides of the module substrate,
  a third via area between the third contact pad area and the fourth contact pad area, and
  a fourth via area between the third via area and the fourth contact pad area,
  the second layer further includes
   a plurality of seventh lines connecting a plurality of contact pads in the third contact pad area on the other side of the module substrate to a plurality of vias in the fourth via area, and
   a plurality of eighth lines connecting a plurality of contact pads in the fourth contact pad area on the other side of the module substrate to a plurality of vias in third via area, and
  the first layer further includes
   a plurality of ninth lines connecting the plurality of contact pads in the fourth contact pad area on the one side of the module substrate to a plurality of vias in the fourth via area,
   a plurality of tenth lines connecting the plurality of contact pads in the third contact pad area on the one side of the module substrate to a plurality of vias in the third via area, and
   a plurality of eleventh lines connecting the plurality of via holes in the third and fourth areas to the first electronic device pair portion.

2. The electronic device module of claim 1, wherein the first and second contact pad areas are arranged in form of a mirror on both sides of the module substrate.

3. The electronic device module of claim 1, wherein the plurality of third lines are formed in a direction crossing the plurality of first lines in the first layer in the first via area.

4. The electronic device module of claim 1, wherein the third and fourth contact pad areas are arranged in form of a mirror on both sides of the module substrate.

5. The electronic device module of claim 4, wherein the plurality of eleventh lines are formed in a direction crossing the plurality of seventh and eighth lines in the second layer in the second via area.

6. The electronic device module of claim 5, wherein the plurality of eleventh lines are between the third via area and the fourth via area.

7. The electronic device module of claim 1, wherein the second via area is arranged near the first contact pad area and the first via is arranged near the second contact pad area.

8. The electronic device module of claim 1, further comprising:
a fifth via area having a plurality of vias connected to the plurality of sixth lines, the second plurality of vias being electrically between the first electronic device pair portion and the second electronic device pair portion.

9. The electronic device module of claim 8, wherein the plurality of vias in the fifth via area is electrically between the plurality of vias in the first and second via areas and the second electronic device pair portion.

10. The electronic device module of claim 9, wherein the plurality of third lines is electrically between the plurality of vias in the first and second via areas.

* * * * *